(12) United States Patent
Kim et al.

(10) Patent No.: US 8,421,070 B2
(45) Date of Patent: *Apr. 16, 2013

(54) ZNO BASED SEMICONDUCTOR DEVICES AND METHODS OF MANUFACTURING THE SAME

(75) Inventors: Chang-jung Kim, Yongin-si (KR); I-hun Song, Yongin-si (KR); Dong-hun Kang, Yongin-si (KR); Young-soo Park, Yongin-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 12/929,324

(22) Filed: Jan. 14, 2011

(65) Prior Publication Data
US 2011/0101343 A1  May 5, 2011

Related U.S. Application Data

(63) Continuation of application No. 11/785,269, filed on Apr. 17, 2007, now Pat. No. 7,893,431.

(30) Foreign Application Priority Data

Apr. 17, 2006 (KR) .................. 10-2006-0034675
May 16, 2006 (KR) .................. 10-2006-0043943
Mar. 26, 2007 (KR) .................. 10-2007-0029380

(51) Int. Cl.
*H01L 29/12* (2006.01)

(52) U.S. Cl.
USPC ............. 257/43; 257/52; 257/57; 257/59; 257/72; 257/290; 257/324; 257/E33.004; 438/482; 438/483

(58) Field of Classification Search ............ 257/43, 257/E33.004; 438/482
See application file for complete search history.

(56) References Cited

U.S. PATENT DOCUMENTS

| | | | |
|---|---|---|---|
| 4,960,718 A | 10/1990 | Aina | |
| 5,337,274 A | 8/1994 | Ohji | |
| 5,656,824 A | 8/1997 | Den Boer et al. | |
| 5,854,139 A | 12/1998 | Aratani et al. | |
| 5,972,527 A | 10/1999 | Kaijou et al. | |

(Continued)

FOREIGN PATENT DOCUMENTS

| | | |
|---|---|---|
| CN | 1348192 | 5/2002 |
| EP | 1 737 044 | 12/2006 |

(Continued)

OTHER PUBLICATIONS

Office Action dated Jan. 13, 2011 in co-pending U.S. Appl. No. 12/453,530.

(Continued)

*Primary Examiner* — N Drew Richards
*Assistant Examiner* — John P Dulka
(74) *Attorney, Agent, or Firm* — Harness, Dickey & Pierce, P.L.C.

(57) ABSTRACT

A semiconductor device may include a composite represented by Formula 1 below as an active layer.

$$x(Ga_2O_3) \cdot y(In_2O_3) \cdot z(ZnO) \quad \text{Formula 1}$$

wherein, about $0.75 \leq x/z \leq$ about 3.15, and about $0.55 \leq y/z \leq$ about 1.70.

Switching characteristics of displays and driving characteristics of driving transistors may be improved by adjusting the amounts of a gallium (Ga) oxide and an indium (In) oxide mixed with a zinc (Zn) oxide and improving optical sensitivity.

17 Claims, 13 Drawing Sheets

U.S. PATENT DOCUMENTS

| | | | |
|---|---|---|---|
| 6,107,734 | A | 8/2000 | Tanaka et al. |
| 6,458,636 | B1 | 10/2002 | Yi et al. |
| 6,552,387 | B1 | 4/2003 | Eitan |
| 6,562,491 | B1 | 5/2003 | Jeon |
| 6,563,174 | B2 | 5/2003 | Kawasaki et al. |
| 6,727,522 | B1 | 4/2004 | Kawasaki et al. |
| 6,727,533 | B2 | 4/2004 | Matsuzaki et al. |
| 6,878,962 | B1 | 4/2005 | Kawasaki et al. |
| 6,882,012 | B2 | 4/2005 | Yamazaki et al. |
| 6,929,970 | B2 | 8/2005 | Andriessen et al. |
| 7,061,014 | B2 | 6/2006 | Hosono et al. |
| 7,067,843 | B2 | 6/2006 | Carcia et al. |
| 7,071,122 | B2 | 7/2006 | Saenger et al. |
| 7,145,174 | B2 | 12/2006 | Chiang et al. |
| 7,188,922 | B2 | 3/2007 | Kubo |
| 7,189,992 | B2 | 3/2007 | Wager, III et al. |
| 7,220,635 | B2 | 5/2007 | Brask et al. |
| 7,285,501 | B2 | 10/2007 | Mardilovich et al. |
| 7,411,209 | B2 | 8/2008 | Endo et al. |
| 7,456,468 | B2 | 11/2008 | Jeon et al. |
| 7,893,431 | B2 * | 2/2011 | Kim et al. ........................ 257/43 |
| 8,299,461 | B2 * | 10/2012 | Tanaka et al. ................... 257/43 |
| 2001/0000756 | A1 | 5/2001 | Batra et al. |
| 2002/0074657 | A1 | 6/2002 | Nakayama et al. |
| 2002/0146624 | A1 | 10/2002 | Goto et al. |
| 2003/0218221 | A1 | 11/2003 | Wager, III et al. |
| 2004/0038446 | A1 | 2/2004 | Takeda et al. |
| 2004/0069990 | A1 | 4/2004 | Mahajani et al. |
| 2004/0127038 | A1 | 7/2004 | Carcia et al. |
| 2004/0155270 | A1 | 8/2004 | Hoffman |
| 2004/0180217 | A1 | 9/2004 | Inoue et al. |
| 2005/0017244 | A1 | 1/2005 | Hoffman et al. |
| 2005/0017302 | A1 | 1/2005 | Hoffman |
| 2005/0039670 | A1 | 2/2005 | Hosono et al. |
| 2005/0062134 | A1 | 3/2005 | Ho et al. |
| 2005/0167668 | A1 | 8/2005 | Korenari et al. |
| 2005/0199959 | A1 | 9/2005 | Chiang et al. |
| 2005/0199960 | A1 | 9/2005 | Hoffman et al. |
| 2005/0258474 | A1 | 11/2005 | Tanaka et al. |
| 2005/0275038 | A1 | 12/2005 | Shih et al. |
| 2006/0003485 | A1 | 1/2006 | Hoffman et al. |
| 2006/0038242 | A1 | 2/2006 | Hsu et al. |
| 2006/0068091 | A1 | 3/2006 | Denda |
| 2006/0079034 | A1 | 4/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0214008 | A1 | 9/2006 | Asami et al. |
| 2006/0220023 | A1 | 10/2006 | Hoffman et al. |
| 2006/0244107 | A1 | 11/2006 | Sugihara et al. |
| 2006/0284172 | A1 | 12/2006 | Ishii |
| 2006/0286737 | A1 | 12/2006 | Levy et al. |
| 2006/0292777 | A1 | 12/2006 | Dunbar |
| 2007/0007538 | A1 | 1/2007 | Ono et al. |
| 2007/0023750 | A1 | 2/2007 | Chiang et al. |
| 2007/0072439 | A1 | 3/2007 | Akimoto et al. |
| 2007/0184576 | A1 | 8/2007 | Chang et al. |
| 2007/0187760 | A1 | 8/2007 | Furuta et al. |
| 2007/0194379 | A1 | 8/2007 | Hosono et al. |
| 2007/0254399 | A1 | 11/2007 | Wang et al. |
| 2008/0067508 | A1 | 3/2008 | Endo et al. |
| 2008/0197414 | A1 | 8/2008 | Hoffman et al. |
| 2008/0206923 | A1 | 8/2008 | Kim et al. |
| 2008/0315194 | A1 | 12/2008 | Kim et al. |
| 2008/0315200 | A1 | 12/2008 | Kim et al. |
| 2010/0127253 | A1 | 5/2010 | Inoue et al. |
| 2011/0101342 | A1 * | 5/2011 | Kim et al. ........................ 257/43 |

FOREIGN PATENT DOCUMENTS

| | | |
|---|---|---|
| JP | 63-265818 | 11/1988 |
| JP | 10-306367 | 11/1998 |
| JP | 2003-017749 | 1/2003 |
| JP | 2004-356196 | 12/2004 |
| JP | 2005-026465 | 1/2005 |
| JP | 2005-033172 | 2/2005 |
| JP | 2005-093974 | 4/2005 |
| JP | 2006-005116 | 1/2006 |
| JP | 2007-073312 | 3/2007 |
| JP | 2007-529119 | 10/2007 |
| KR | 10-2000-0074893 | 12/2000 |
| KR | 10-2005-0092712 | 9/2005 |
| KR | 10-2006-0114469 | 11/2006 |
| KR | 10-2007-0090182 | 9/2007 |
| KR | 10-0811997 | 3/2008 |
| WO | WO 2005/074038 A1 | 8/2005 |
| WO | WO 2005/088726 A1 | 9/2005 |
| WO | WO 2007/040194 | 4/2007 |
| WO | WO 2007/119386 | 10/2007 |

OTHER PUBLICATIONS

International Search Report dated May 21, 2008, issued in Application No. PCT/KR2008/000763.
U.S. Office Action dated Aug. 20, 2009, issued in U.S. Appl. No. 11/785,269.
U.S. Office Action dated Nov. 16, 2009, issued in U.S. Appl. No. 12/213,399.
U.S. Office Action dated May 21, 2010, issued in U.S. Appl. No. 11/785,269.
U.S. Notice of Allowance dated Oct. 14, 2010, issued in U.S. Appl. No. 11/785,269.
U.S. Office Action dated Nov. 24, 2010, issued in U.S. Appl. No. 11/978,581.
U.S. Office Action dated Dec. 3, 2010, issued in U.S. Appl. No. 12/071,097.
U.S. Supplemental Notice of Allowance dated Dec. 27, 2010, issued in U.S. Appl. No. 11/785,269.
U.S. Office Action dated Feb. 25, 2011, issued in U.S. Appl. No. 12/213,402.
U.S. Office Action dated Jul. 7, 2011, issued in co-pending U.S. Appl. No. 12/453,530.
The MOSFET—Introduction, MOS Field Effect Transistors, B.J. Van Zeghbroeck, Web book "Principles of Semiconductor Devices", Boulder, Dec. 2004, Chapter 7.
U.S. Office Action dated Jun. 27, 2011, issued in co-pending U.S. Appl. No. 12/071,097.
U.S. Office Action dated Jul. 25, 2011, issued in co-pending U.S. Appl. No. 12/213,402.
U.S. Office Action dated Oct. 6, 2011, issued in co-pending U.S. Appl No 11/978,581.
U.S. Office Action dated Nov. 23, 2011, issued in co-pending U.S. Appl. No. 12/071,097.
Notice of Allowance issued Dec. 8, 2011 in co-pending U.S. Appl. No. 12/213,402.
Office Action issued by the European Patent Office dated May 10, 2011 for EP Application No. 09 160 223.5-1528.
European Search Report dated Sep. 14, 2009 in European Application No. 07746038.4.
Nomura et al., "Room-temperature fabrication of transparent thin-film transistors using amorphous oxide semiconductors", Nature, vol. 432, pp. 488-492 (Nov. 25, 2004).
Office Action mailed May 11, 2010 for co-pending U.S. Appl. No. 11/978,581.
Office Action mailed Sep. 12, 2008 for co-pending U.S. Appl. No. 11/898,037.
Office Action mailed Jun. 25, 2009 for co-pending U.S. Appl. No. 11/898,037.
Office Action mailed Mar. 6, 2009 for co-pending U.S. Appl. No. 11/898,037.
Office Action mailed Apr. 2, 2010 for co-pending U.S. Appl. No. 12/213,327.
Office Action mailed Sep. 15, 2009 for co-pending U.S. Appl. No. 12/213,327.
International Search Report dated Dec. 19, 2008.
International Search Report dated Sep. 25, 2008.
European Search Report dated Aug. 28, 2009.

European Search Report and Written Opinion dated Jun. 16, 2010.
European Search Report and Written Opinion dated Jun. 14, 2010.
Chinese Office Action dated Aug. 23, 2010 and English translation thereof.
Chinese Office Action dated Oct. 25, 2010 and English translation thereof.
Chinese Office Action dated Aug. 4, 2010 and English translation thereof.
Japanese Office Action dated Jan. 1, 2012 issued in Japanese Application No. 2009-506414.
European Search Report dated Jan. 23, 2012 issued in European Application No. 11183826.4.
European Exam Report dated Jan. 23, 2012 issued in European Application No. 09160223.5.
U.S. Notice of Allowance dated Apr. 5, 2012 issued in U.S. Appl. No. 12/213,402.
U.S. Office Action dated Apr. 6, 2012 issued in U.S. Appl. No. 11/978,581.
U.S. Office Action dated Apr. 13, 2012 issued in U.S. Appl. No. 12/929,323.
Carcia, P.F. et al. "Transparent ZnO thin-film transistor fabricated by rf magnetron sputtering," *Applied Physics Letters*, vol. 82, No. 7 (Feb. 17, 2003): pp. 1117-1119.
International Search Report and Written Opinion dated Jul. 25, 2007 issued in International Application No. PCT/KR2007/001875.
Chinese Office Action dated Aug. 23, 2012, issued in Application No. 200910140975.3 and English translation thereof.
Japanese Office Action dated Nov. 20, 2012, issued in Application No. 2010-513115 and English translation thereof.

* cited by examiner

ZNO BASED SEMICONDUCTOR DEVICES AND METHODS OF MANUFACTURING THE SAME

CROSS-REFERENCE TO RELATED APPLICATIONS

This application is a continuation of, and claims priority under 35 U.S.C. §120 to, U.S. application Ser. No. 11/785,269, filed Apr. 17, 2007, now U.S. Pat. No. 7,983,431 which claims priority under 35 U.S.C. §119 to Korean Patent Application No. 10-2006-0034675, filed on Apr. 17, 2006, Korean Patent Application No. 10-2006-0043943, filed on May 16, 2006, and Korean Patent Application No. 10-2007-0029380, filed on Mar. 26, 2007 in the Korean Intellectual Property Office (KIPO), the entire contents of all of which are incorporated herein by reference.

BACKGROUND

1. Field

Example embodiments relate to a semiconductor device and methods of manufacturing the same. Other example embodiments relate to a ZnO based thin film transistor including an active layer using a composite semiconductor material in which a zinc (Zn) oxide is doped with gallium (Ga) and indium (In) and methods of manufacturing the same.

2. Description of the Related Art

Research on organic light-emitting diodes (OLED) having a relatively large area has been actively conducted. As a driving transistor for OLEDs, a transistor that stably operates with constant current characteristics and has improved durability needs to be developed. Amorphous silicon TFTs may be manufactured using a low temperature process, but such TFTs may have relatively low mobility and may not satisfy constant current bias conditions. On the other hand, polycrystalline silicon TFTs may have increased mobility and may satisfy constant current test conditions, but may not have uniform characteristics. Thus, polycrystalline silicon TFTs may not have relatively large areas and may require high temperature processes.

ZnO materials may have conductivity, semiconductivity, and resistance according to their oxygen content. A transistor including a ZnO based semiconductor material as an active layer has been reported. In order to apply the transistor including a ZnO based semiconductor material as an active layer to display devices including OLEDs and LCDs, stable driving characteristics, which present constant characteristics in an on or off state, may be required in addition to constant current characteristics.

SUMMARY

Example embodiments provide an amorphous ZnO based thin film transistor having constant driving characteristics in an on or off state due to improved optical sensitivity, and methods of manufacturing the same.

According to example embodiments, a semiconductor device may include a substrate, an active layer including a composite represented by Formula 1 below, on the substrate, source and drain electrodes electrically connected to the active layer, a gate electrode on the active layer, and a gate insulating layer between the gate electrode and the active layer:

$$x(Ga_2O_3).y(In_2O_3).z(ZnO) \quad \text{Formula 1}$$

wherein, about $0.75 \leq x/z \leq$ about 3.15, and about $0.55 \leq y/z \leq$ about 1.70.

According to example embodiments, x, y, and z may be about $0.85 \leq x/z \leq$ about 3.05, and about $0.65 \leq y/z \leq$ about 1.70 in Formula 1. According to example embodiments, x, y, and z may be about $1.15 \leq x/z \leq$ about 2.05, and about $1.15 \leq y/z \leq$ about 1.70 in Formula 1. According to example embodiments, x, y, and z may be about $1.25 \leq x/z \leq$ about 1.95, and about $1.25 \leq y/z \leq$ about 1.70 in Formula 1. According to example embodiments, x, y, and z may be about $1.25 \leq x/z \leq$ about 1.45, and about $1.45 \leq y/z \leq$ about 1.65 in Formula 1.

According to example embodiments, a method of manufacturing a semiconductor device may include forming an active layer including a composite represented by Formula 1 below, source and drain electrodes, a gate insulating layer and a gate electrode on a substrate, $$x(Ga_2O_3).y(In_2O_3).z(ZnO) \quad \text{Formula 1}$$

wherein, about $0.75 \leq x/z \leq$ about 3.15, and about $0.55 \leq y/z \leq$ about 1.70.

According to example embodiments, the active layer may be formed on the substrate, the source and drain electrodes may be formed to be electrically connected to the active layer, the gate insulating layer may be formed on the active layer, and the gate electrode may be formed on the active layer. On the other hand, the gate electrode may be formed on the substrate, the gate insulating layer may be formed on the gate electrode, the active layer may be formed on the gate insulating layer, and the source and drain electrodes may be formed to be electrically connected to the active layer.

BRIEF DESCRIPTION OF THE DRAWINGS

Example embodiments will be more clearly understood from the following detailed description taken in conjunction with the accompanying drawings. FIGS. 1-5 represent non-limiting, example embodiments as described herein.

FIG. 1 is a schematic cross-sectional view of a semiconductor device according to example embodiments;

FIG. 2 is a schematic cross-sectional view of a semiconductor device according to example embodiments;

FIG. 5 is a graph illustrating results of an inductively coupled plasma (ICP) analysis of ZnO based TFTs;

Figure 1:
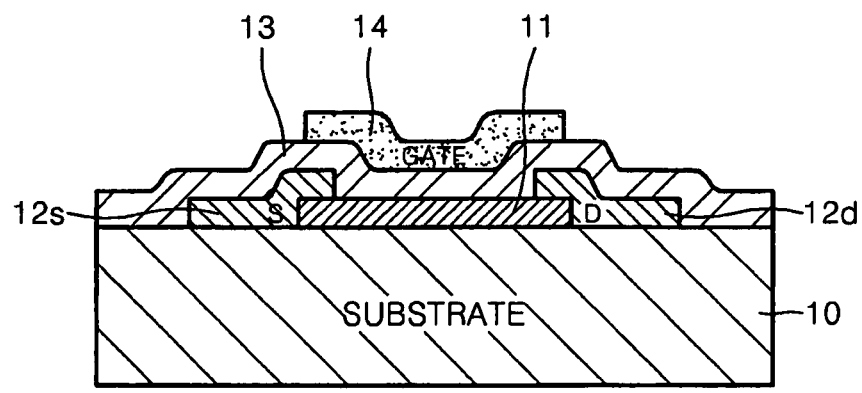

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative

DETAILED DESCRIPTION OF EXAMPLE EMBODIMENTS

Hereinafter, example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a semiconductor device according to example embodiments. Referring to FIG. 1, a patterned active layer 11 including an amorphous ZnO based composite semiconductor may be formed on a substrate 10, and source and drain electrodes 12s and 12d may be formed on ends of the patterned active layer as illustrated in FIG. 1. The source and drain electrodes 12s and 12d may overlap with the ends of the patterned active layer 11 in a predetermined or given width, and may be insulated from a gate electrode 14.

The active layer 11 may include an amorphous ZnO based composite material represented by Formula 1 below.

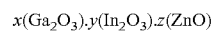

$$x(Ga_2O_3).y(In_2O_3).z(ZnO) \quad \text{Formula 1}$$

wherein, about $0.75 \leq x/z \leq$ about 3.15, and about $0.55 \leq y/z \leq$ about 1.70.

In the amorphous ZnO based composite semiconductor, when the amount of Ga is too low, the Ioff current may increase when exposed to light due to its light-sensitive characteristics. On the other hand, when the amount of Ga is too high, an Ion/Ioff ratio may decrease, resulting in the deterioration of TFT characteristics. When the amount of Ion current is too low, mobility of a carrier may decrease. On the other hand, when the amount of In current is too high, threshold voltage may vary due to its light-sensitive characteristics.

In the above formula, x, y and z may be about $0.75 \leq x/z \leq$ about 3.15, and about $0.55 \leq y/z \leq$ about 1.70, for example, about $0.85 \leq x/z \leq$ about 3.05, and about $0.65 \leq y/z \leq$ about 1.70, or about $1.15 \leq x/z \leq$ about 2.05, and $1.15 \leq y/z \leq 1.70$, or about $1.25 \leq x/z \leq$ about 1.95, and about $1.25 \leq y/z \leq$ about 1.70, or about $1.25 \leq x/z \leq$ about 1.45, and about $1.45 \leq y/z \leq$ about 1.65.

The amorphous ZnO based composite semiconductor material represented by Formula 1 may be applied to a low temperature deposition, e.g., a plastic substrate and a soda lime glass. The amorphous property may provide uniformity for a display having relatively large areas. The amorphous ZnO based composite semiconductor may be formed using a composite target of a gallium (Ga) oxide, an indium (In) oxide, and a zinc (Zn) oxide by a conventional sputtering method, and also formed using chemical vapor deposition (CVD) and/or an atomic layer deposition (ALD).

The source and drain electrodes 12s and 12d may be formed of a conductive metal oxide or a metal. Examples of the conductive metal oxide may include commonly available tin-doped indium oxide (ITO), indium zinc oxide (IZO), and/or aluminum-doped zinc oxide (ZAO), and examples of the metal may include titanium (Ti), platinum (Pt), chromium (Cr), tungsten (W), aluminum (Al), nickel (Ni), copper (Cu), molybdenum (Mo), tantalum (Ta), and/or an alloy thereof. When a metal layer is used as the source and drain electrodes, a plurality of metal layers may be formed. When the metal layer is used, an $n^+$ layer may be formed between the metal layer and the active layer to improve contact characteristics, and the $n^+$ layer may be formed using a conductive metal oxide or an oxygen vacant Ga oxide-In oxide-Zn oxide composite. The substrate may be a silicon substrate, a glass substrate and/or a plastic substrate.

A gate insulating layer 13 may be formed on the active layer 11 and the source/drain electrodes 12s and 12d. A commonly available gate insulating material may be used to form the gate insulating layer 13, for example, a high dielectric oxide (e.g., a silicon nitride, a silicon oxide, a hafnium oxide and/or an aluminum oxide), may be used.

A gate electrode 14 may be formed on the gate insulating layer 13 and may correspond to the active layer 11. The gate electrode 14 may be formed using the same metal used for a source/drain electrode layer 120 or other metals. For example, a metal of Ti, Pt, Cr, W, Al, Ni, Cu, Mo, or Ta, or an alloy thereof may be used. When the metal layer is used as the gate electrode, a plurality of metal layers may be formed. A metal oxide may also be used.

Figure 2:
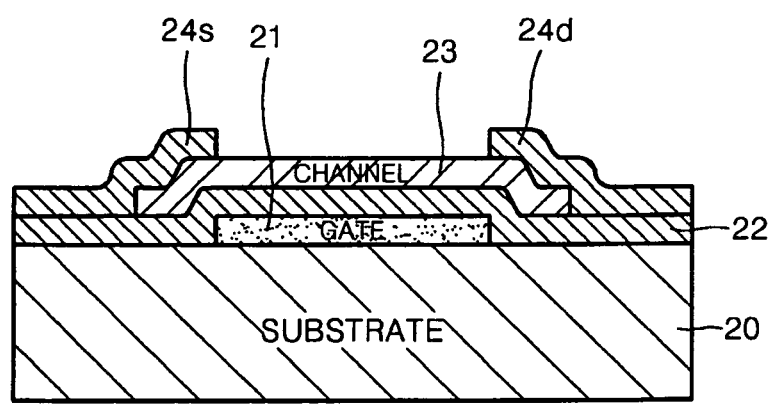

The semiconductor device may have the structure illustrated in FIG. 2 by disposing the gate electrode in a different way from the structure illustrated in FIG. 1. Referring to FIG. 2, a gate electrode 21 may be formed on a substrate 20, and a gate insulating layer 22 may be formed on the gate electrode 21. A patterned active layer 23 including an amorphous ZnO based composite semiconductor may be formed on the gate insulating layer 22. Source and drain electrodes 24s and 24d may be formed on ends of the patterned active layer 23.

Another example of a semiconductor device according to example embodiments may also have a structure in which source/drain electrodes may be formed on a gate insulating layer and then an active layer may be formed on the source/drain electrodes, besides the stack structure illustrated in FIGS. 1 and 2.

Figure 3A:
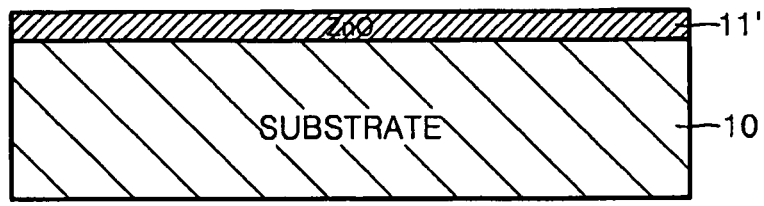
FIGS. 3A-3G are cross-sectional views illustrating a method of manufacturing the example embodiment shown in FIG. 1.

A method of manufacturing a semiconductor device according to example embodiments will now be described in detail. FIGS. 3A-3G are cross-sectional views illustrating a method of manufacturing the semiconductor device shown in FIG. 1. As shown in FIG. 3A, a semiconductor material layer 11' may be formed on the substrate 10 to form the active layer 11 using a RF magnetron sputtering method, a DC magnetron sputtering method, a chemical vapor deposition (CVD) method and/or an atomic layer deposition (ALD) method.

Figure 3B:
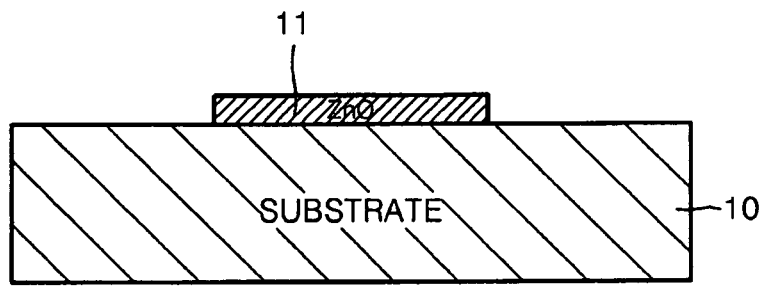
Figure 3C:
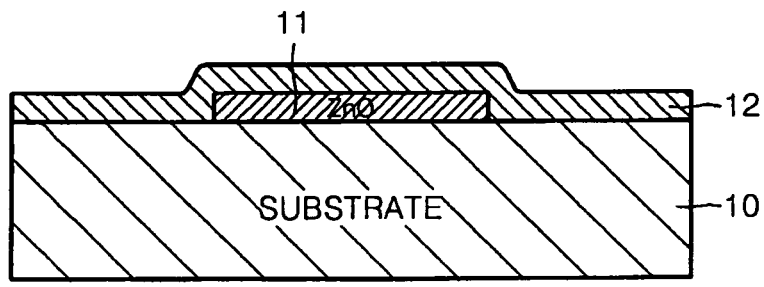

As shown in FIG. 3B, the semiconductor material layer 11' may be patterned using a photolithographic method to obtain the active layer 11. As shown in FIG. 3C, a source/drain material layer 12 may be formed on the entire surface of the active layer 11 using a RF magnetron sputtering method, a CVD method, a vacuum evaporation method, an e-beam evaporation method and/or an ALD method.

Figure 3D:
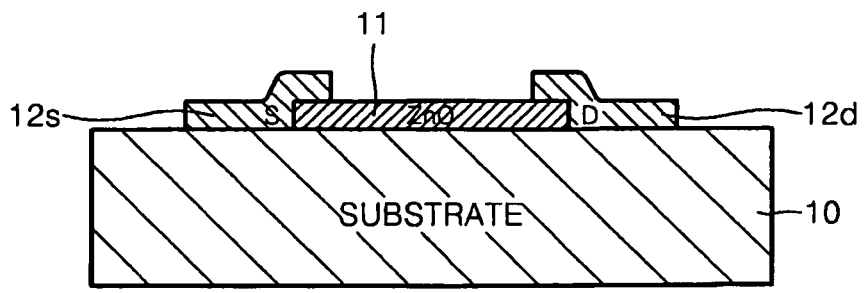
Figure 3E:
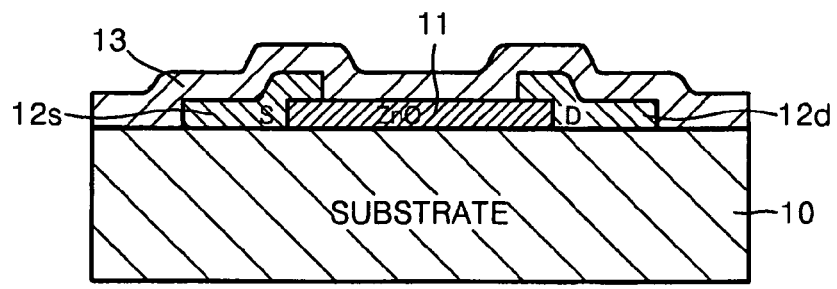
Figure 3F:
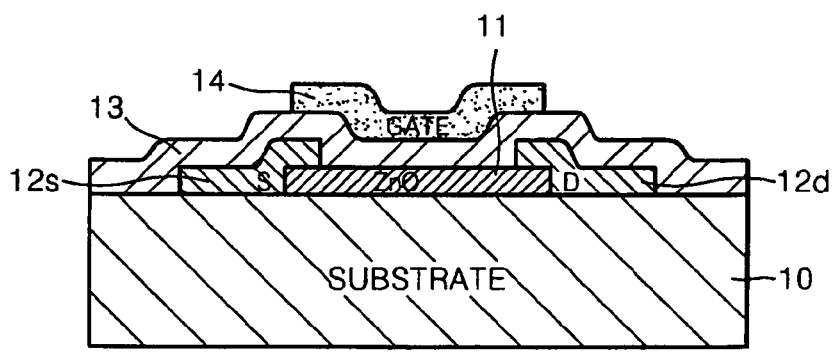

As shown in FIG. 3D, the source/drain material layer 12 may be patterned to form the source and drain electrodes 12s and 12d contacting the ends of the active layer 11. As shown in FIG. 3E, a material that is used to form the gate insulating layer 13 may be deposited using a conventional method, e.g., chemical vapor deposition (CVD) method and/or a plasma enhanced chemical vapor deposition (PECVD) method, to form the gate insulating layer 13 covering the source and drain electrodes 12s and 12d on the entire surface of the resultant stack structure. As shown in FIG. 3F, a material for forming a gate electrode may be deposited and patterned to form the gate electrode 14 facing the active layer 11.

Figure 3G:
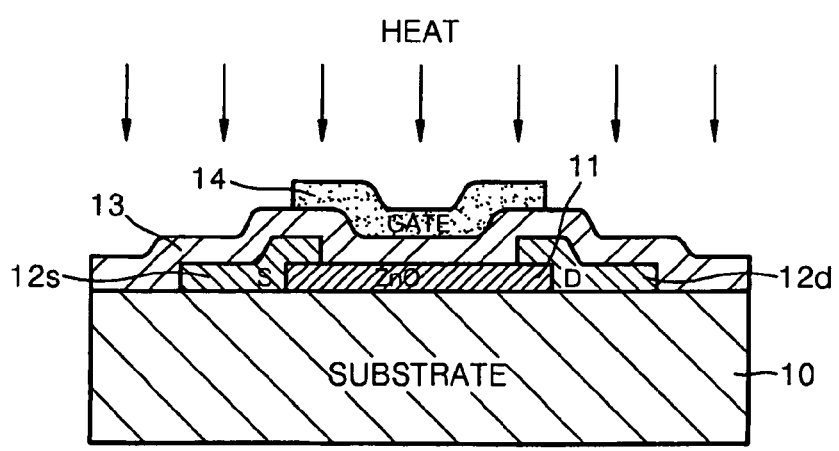

As shown in FIG. 3G, the stack structure including the active layer 11 and the source and drain electrodes 12s and 12d contacting the ends of the active layer 11 may be annealed at a temperature of about 400° C. or less. Annealing may be performed using a general furnace, a rapid thermal annealing (RTA), a laser, or a hot plate in a nitrogen atmosphere. Annealing may stabilize a contact between the active layer 11 and the source/drain electrodes 12s and 12d.

Figure 4A:
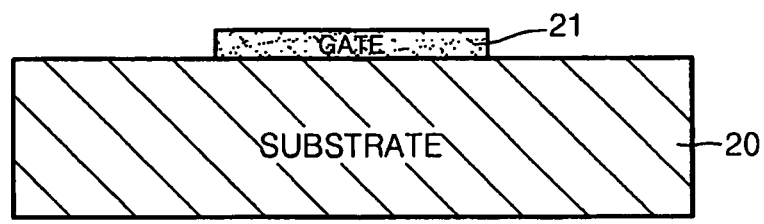
FIGS. 4A-4E are cross-sectional views illustrating a method of manufacturing another example embodiment shown in FIG. 2.
Figure 4B:
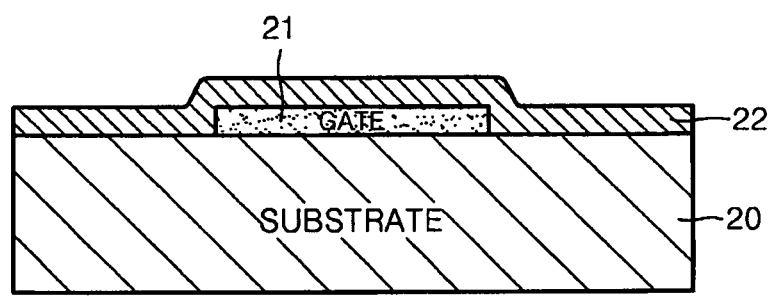
Figure 4C:
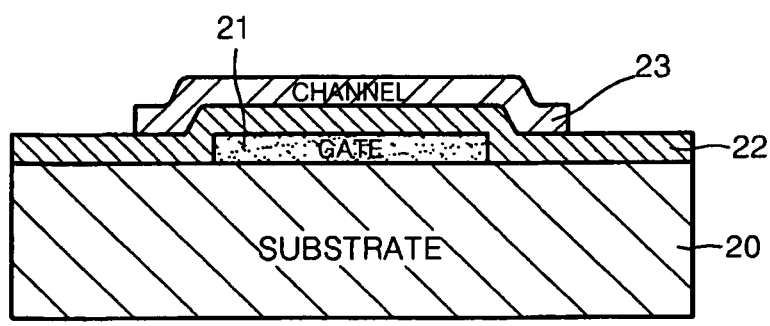
Figure 4D:
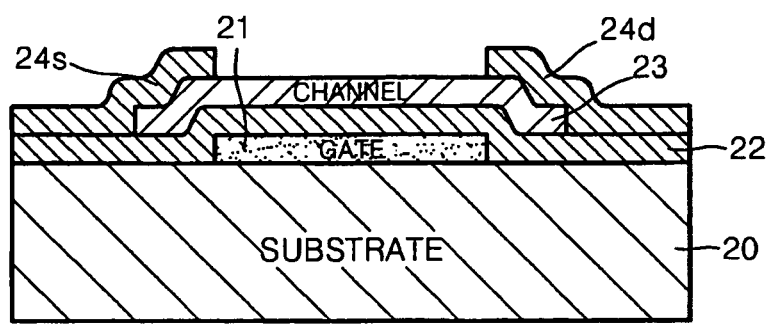

FIGS. 4A-4E are cross-sectional views illustrating a method of manufacturing the semiconductor device shown in FIG. 2. As shown in FIG. 4A, a material for forming the gate electrode 21 may be deposited on the substrate 20 and patterned to form the gate electrode 21. As shown in FIG. 4B, the gate insulating layer 22 may be formed on the gate electrode 21. The gate insulating layer 22 may be formed using CVD or PECVD. As shown in FIG. 4C, a semiconductor film formed using a target that for forming an amorphous ZnO based composite semiconductor represented by Formula 1 above may be patterned to obtain the active layer 23 using a photolithographic method. As shown in FIG. 4D, a source/drain electrode material may be deposited and patterned to obtain the source and drain electrodes 24s and 24d.

Figure 4E:
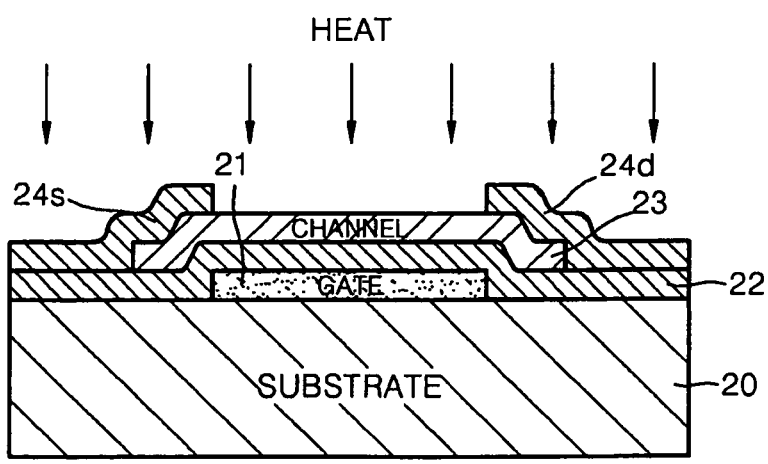

As shown in FIG. 4E, the stack structure including the active layer 23 and the source and drain electrodes 24s and 24d contacting the ends of the active layer 23 may be annealed. Annealing may be performed at a temperature of about 450° C. or less, for example, about 200° C. to about 350° C., in an inert gas atmosphere, e.g., a nitrogen atmosphere. The annealing may be performed using a general furnace, a RTA, a laser, or a hot plate. Annealing may stabilize a contact between the active layer 23 and the source/drain electrodes 24s and 24d.

A semiconductor film may be formed using a composite oxide target of gallium (Ga), indium (In), and zinc (Zn) in an atomic ratio of about 1:1:1, about 2:2:1, about 3:2:1 and about 4:2:1 by using molybdenum (Mo) as a gate electrode material after forming a silicon nitride layer using a gate insulating material. The semiconductor film may be patterned to form an active layer. IZO may be deposited and patterned to form source/drain electrodes, the resultant may be annealed in a nitrogen atmosphere and a passivation layer may be formed of a silicon oxide.

Figure 5:
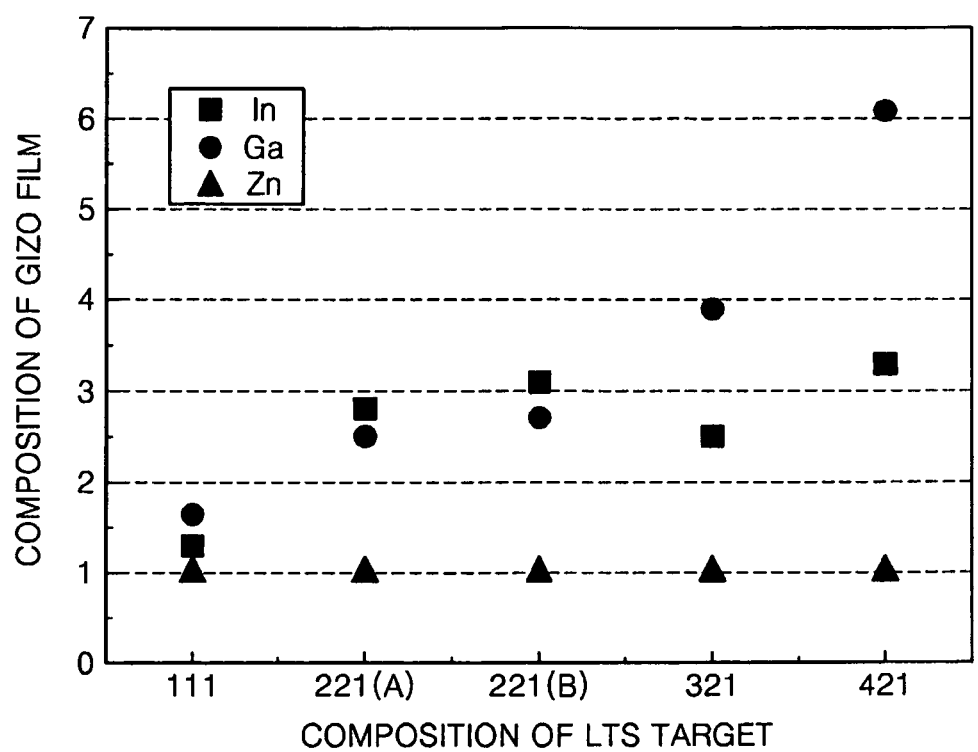

An inductively coupled plasma (ICP) analysis on the semiconductor film formed according to the processes described above may be performed to measure the ratio of gallium (Ga), indium (In) and zinc (Zn), and the results are shown in Table 1 below and FIG. 5. Variations in a gate voltage (Vg) and a drain current (Id), when both light is on and off, are measured, and the results are shown in FIGS. 6-10.

TABLE 1

| Ga, In, Zn atomic ratio in the target | 1:1:1 | 2:2:1 | 2:2:1 | 3:2:1 | 4:2:1 |
|---|---|---|---|---|---|
| Ga:In:Zn atom ratio | 1.7:1.3:1.0 | 2.5:2.8:1.0 | 2.7:3.1:1.0 | 3.9:2.5:1.0 | 6.1:3.2:1.0 |

TABLE 1-continued

Figure 6:
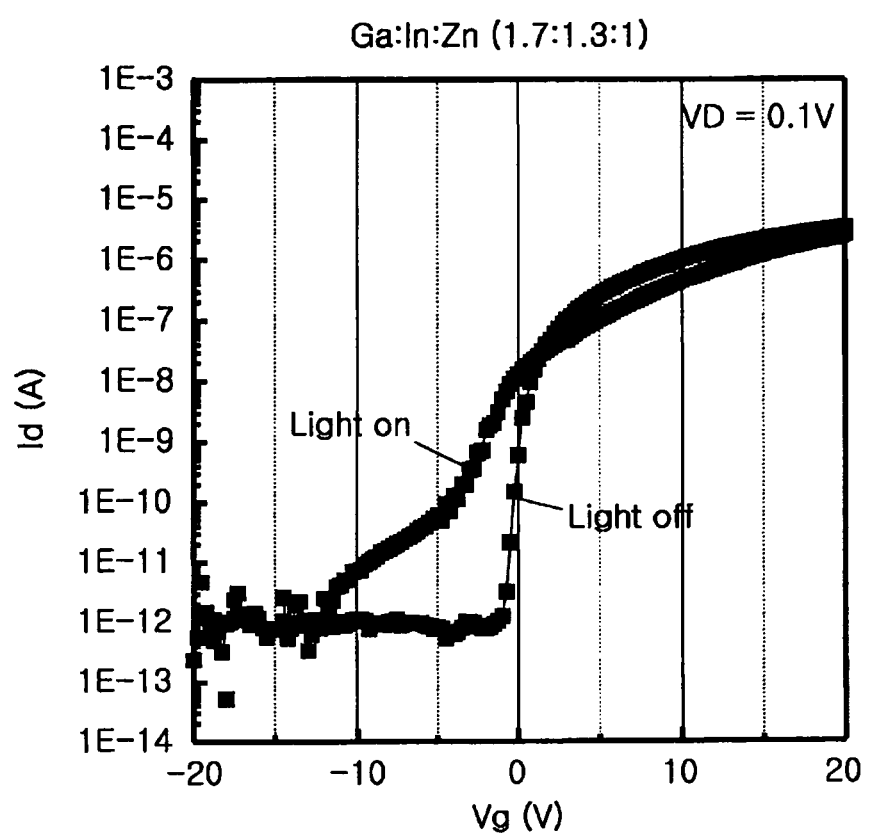
FIGS. 6-10 are graphs illustrating results of an optical sensitivity analysis of ZnO based TFTs, and variations in a gate voltage (Vg) and a drain current (Id)
Figure 7:
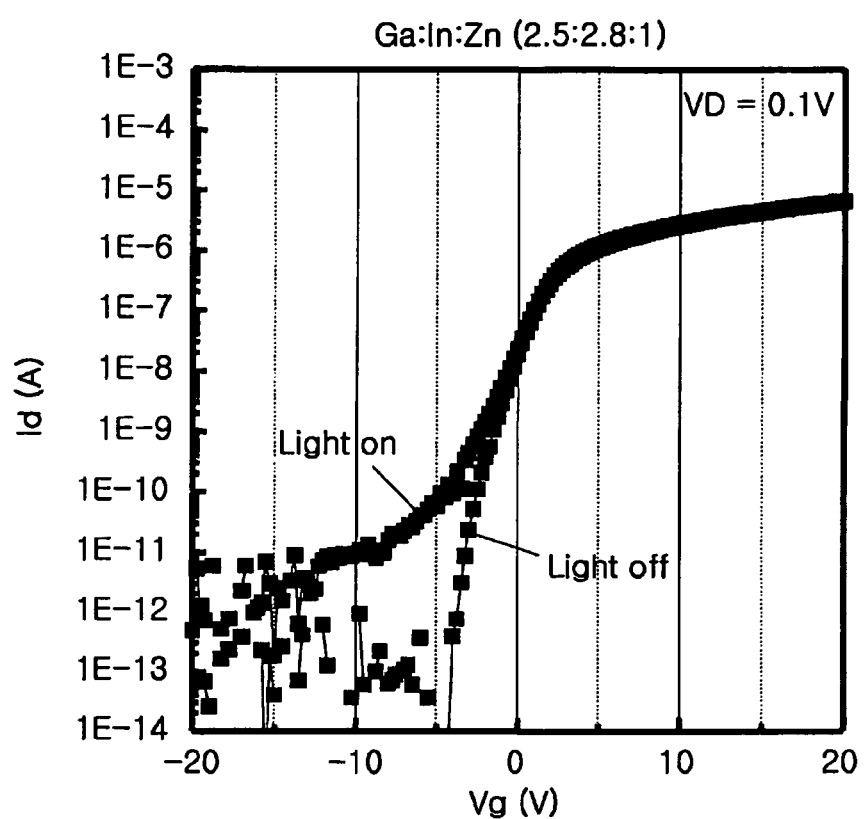
Figure 8:
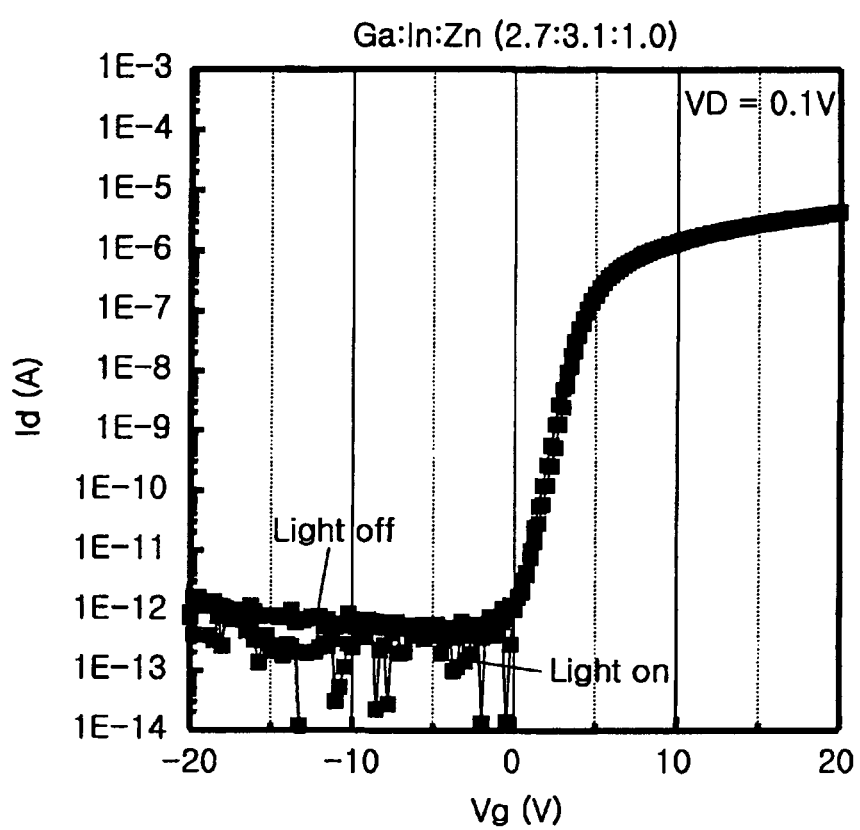
Figure 9:
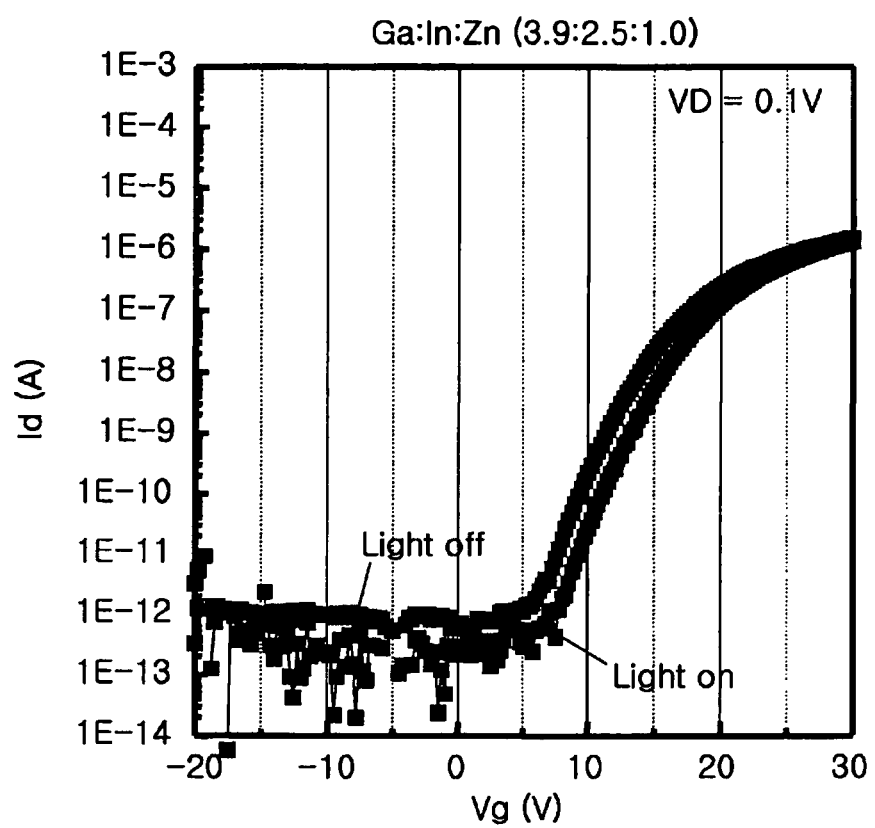
Figure 10:
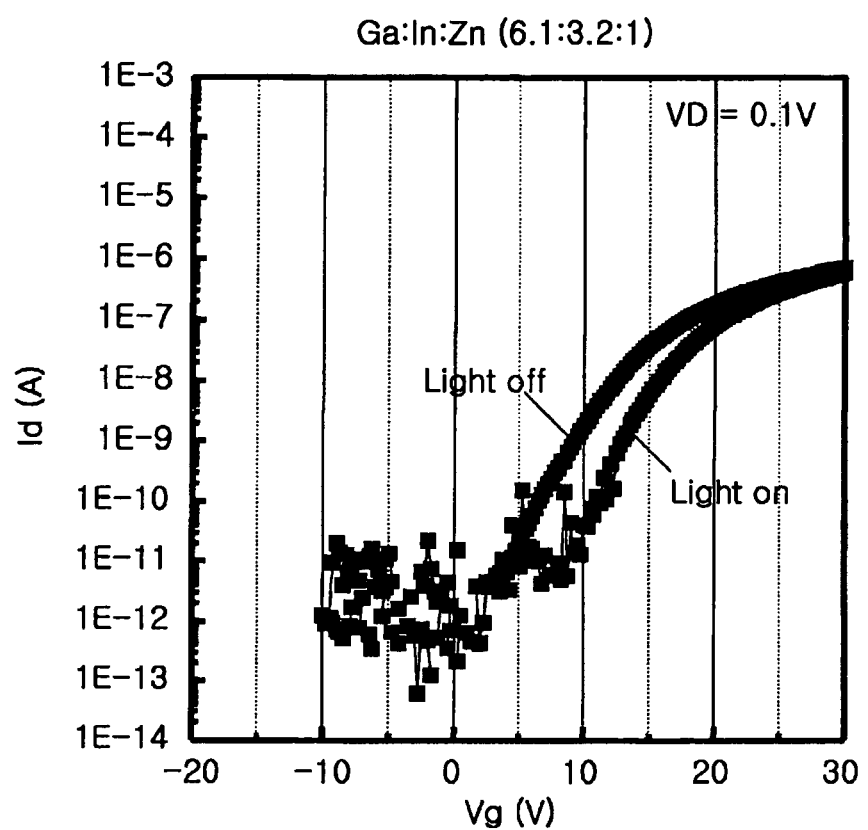

| in active layer (ICP analysis) | | | | | |
|---|---|---|---|---|---|
| x/z | 0.85 | 1.25 | 1.35 | 1.95 | 3.05 |
| y/z | 0.65 | 1.4 | 1.55 | 1.25 | 1.60 |
| optical sensitivity analysis results | FIG. 6 | FIG. 7 | FIG. 8 | FIG. 9 | FIG. 10 |

* error range of ±0.2 in ICP analysis

Figure 11:
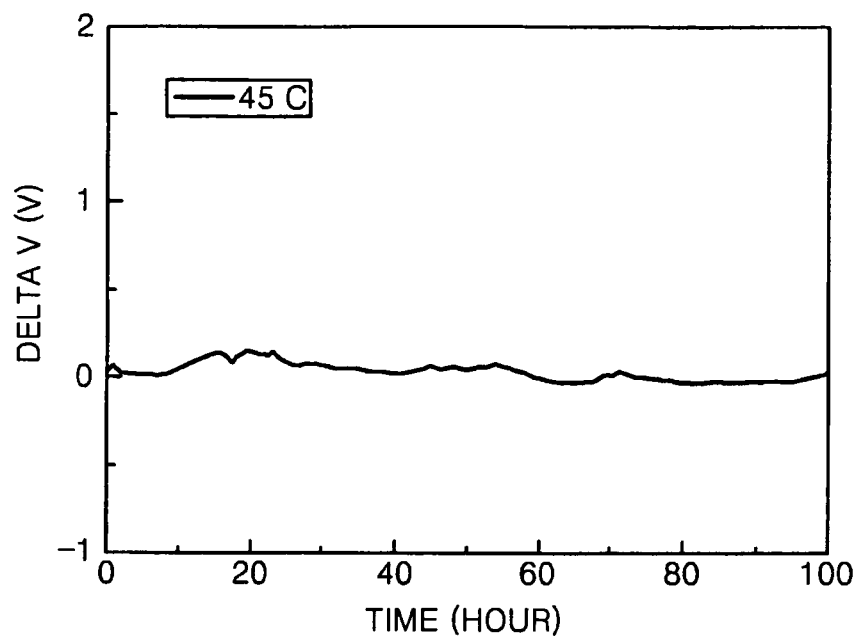
FIG. 11 is a graph illustrating results of a constant current test of a ZnO based TFT.

A constant current test was performed using a TFT having a Ga:In:Zn ratio of about 2.7:3.1:1.0, and the results are shown in FIG. 11. The constant current test may be performed at a temperature of about 45° C. for about 100 hours and a current applied to the source-drain electrodes may be about 3 μA. As illustrated in FIG. 11, a voltage variation (Delta V) between the source and drain electrodes remained at about 0.3 V or less. In addition, variations in a gate voltage (Vg) and a drain current (Id) before and after a constant current test were measured, and the results are illustrated in FIGS. 12 and 13.

Figure 12:
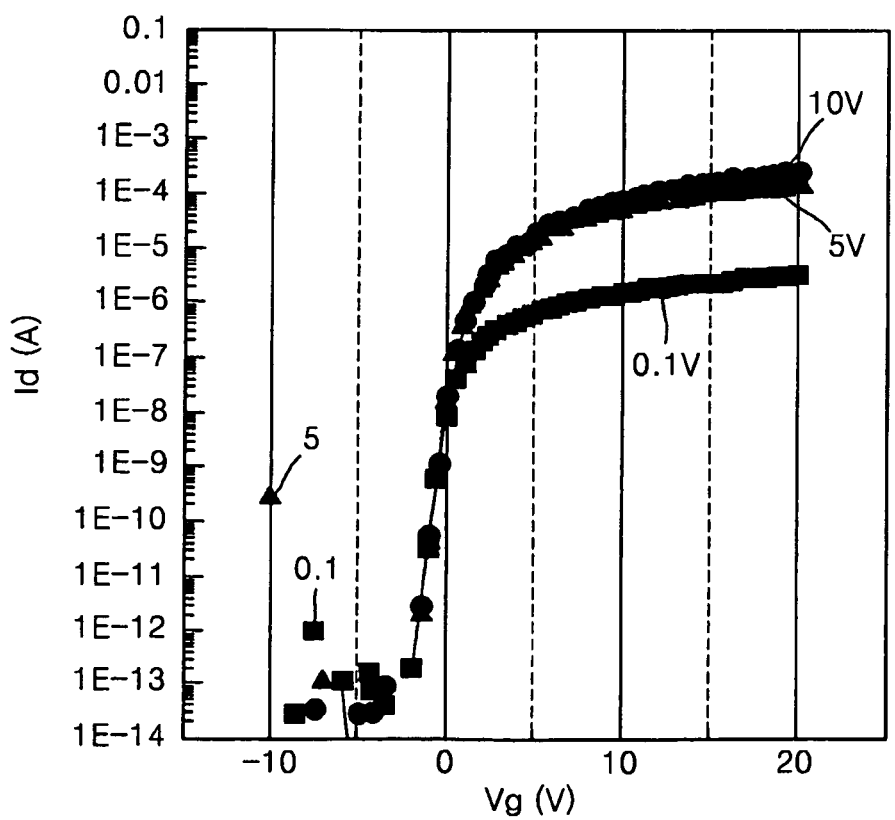
FIGS. 12 and 13 are graphs illustrating variations in a gate voltage (Vg) and a drain current (Id) of the ZnO based TFT before and after the constant current test.
Figure 13:
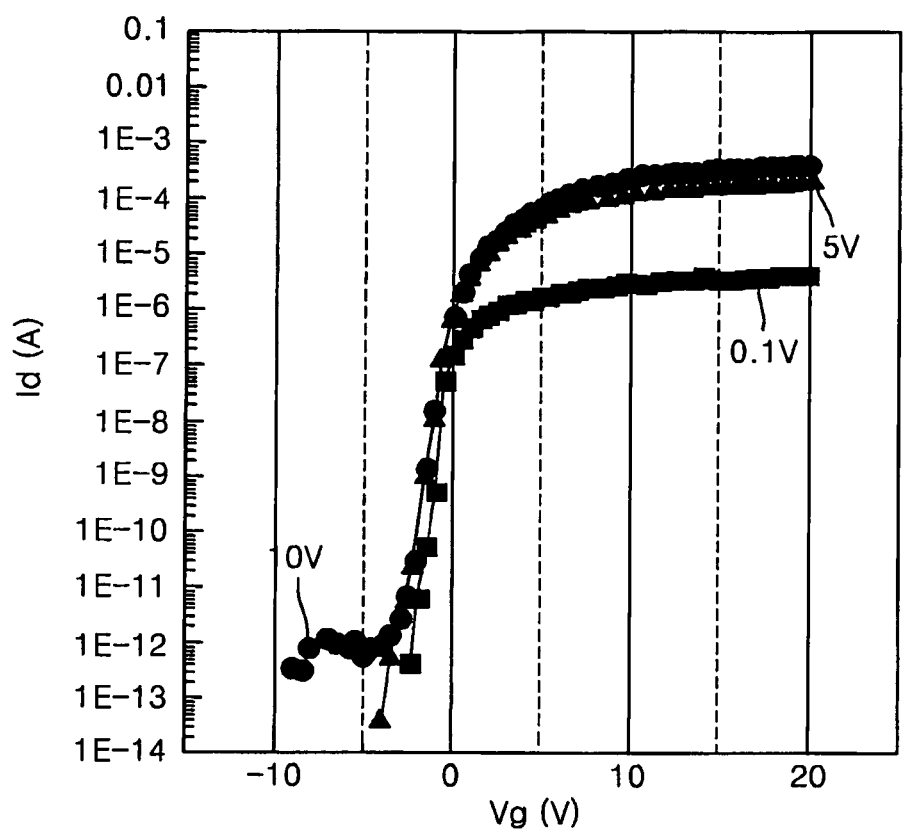

FIG. 12 is a graph illustrating results measured before a constant current test. An on-current may be about $10^{-4}$ A, and an off-current may be about $10^{-12}$ A, and thus the ratio of the on-current to the off current may be about $10^8$. Mobility on the active layer may be about 40 cm$^2$/Vs, and a gate swing voltage may be about 0.385 V/dec. FIG. 13 is a graph illustrating results measured after a constant current test. Upon comparing FIGS. 12 and 13, the constant current test results may not differ greatly from each other. In other words, the ZnO based TFT may maintain its original electrical characteristics even after a constant current test in which about 3 μA may be applied for 100 hours.

According to example embodiments, an electrically stable TFT may be obtained by using an active layer including an amorphous ZnO based composite semiconductor due to improved optical sensitivity. The amorphous property of the ZnO based composite semiconductor may provide improved uniformity, and thus may be applied to display devices having relatively large areas.

Various electronic devices and apparatuses using the ZnO based TFT according to example embodiments may be manufactured by those of ordinary skill in the art according to example embodiments. While example embodiments have been particularly shown and described with reference to example embodiments thereof, it will be understood by those of ordinary skill in the art that various changes in form and details may be made therein without departing from the spirit and scope of the following claims.

What is claimed is:

1. A display device including a semiconductor device comprising:
   a substrate;
   an active layer including a composite represented by Formula 1 below, on the substrate;
   source and drain electrodes electrically connected to the active layer;
   a gate electrode on the active layer; and
   a gate insulating layer between the gate electrode and the active layer:

$$x(Ga_2O_3).y(In_2O_3).z(ZnO) \quad \text{Formula 1}$$

wherein x, y, and z are about $1.25 \leq x/z \leq$ about 1.45, and about $1.45 \leq y/z \leq$ about 1.65 in Formula 1, and wherein, when a drain current is $1E^{-10}$A, the difference of V(light on) and V(light off) is equal to or less than 5V.

2. The display device of claim 1, wherein the source and drain electrodes are formed of a metal oxide selected from the group consisting of tin-doped indium oxide (ITO), indium zinc oxide (IZO), and aluminum-doped zinc oxide (ZAO).

3. The display device of claim 1, wherein the source and drain electrodes include a metal selected from the group consisting of titanium (Ti), platinum (Pt), chromium (Cr), tungsten (W), aluminum (Al), nickel (Ni), copper (Cu), molybdenum (Mo), tantalum (Ta) and an alloy thereof.

4. The display device of claim 3, wherein the source and drain electrodes are formed of a plurality of metal layers.

5. The display device of claim 3, wherein an n$^+$ layer is formed between the source or drain electrode and the active layer.

6. The display device of claim 1, wherein the gate insulating layer includes a nitride, an oxide, or a high dielectric oxide.

7. The display device of claim 1, wherein the gate electrode includes a metal selected from the group consisting of titanium (Ti), platinum (Pt), chromium (Cr), tungsten (W), aluminum (Al), nickel (Ni), copper (Cu), molybdenum (Mo), tantalum (Ta) and an alloy thereof.

8. The display device of claim 1, wherein the substrate is a glass substrate or a plastic substrate.

9. The display device of claim 1, wherein the active layer is amorphous.

10. A method of manufacturing a display device including a semiconductor device, the method comprising:
    forming an active layer including a composite represented by Formula 1 below, source and drain electrodes, a gate insulating layer and a gate electrode on a substrate, $$x(Ga_2O_3).y(In_2O_3).z(ZnO) \quad \text{Formula 1}$$

wherein, x, y, and z are about $1.25 \leq x/z \leq$ about 1.45, and about $1.45 \leq y/z \leq$ about 1.65 in Formula 1, and wherein, when a drain current is $1E^{-10}$A, the difference of V(light on) and V(light off) is equal to or less than 5V.

11. The method of claim 10, wherein the active layer is formed on the substrate, the source and drain electrodes are formed to be electrically connected to the active layer, the gate insulating layer is formed on the active layer, and the gate electrode is formed on the active layer.

12. The method of claim 10, wherein the gate electrode is formed on the substrate, the gate insulating layer is formed on the gate electrode, the active layer is formed on the gate insulating layer, and the source and drain electrodes are formed to be electrically connected to the active layer.

13. The method of claim 10, wherein the source and drain electrodes are formed of a metal oxide.

14. The method of claim 10, further comprising:
    forming an n$^+$ layer between the active layer and the source and drain electrodes.

15. The method of claim 10, further comprising:
    annealing the active layer and the source and drain electrodes, after forming the active layer and the source and drain electrodes.

16. The method of claim 15, wherein annealing is performed at a temperature of about 400° C. or less in a nitrogen atmosphere.

17. The method of claim 10, wherein the active layer is amorphous.

* * * * *